(12) United States Patent
Farooq et al.

(10) Patent No.: US 12,431,408 B2
(45) Date of Patent: Sep. 30, 2025

(54) TSV AND BACKSIDE POWER DISTRIBUTION STRUCTURE

(71) Applicant: International Business Machines Corporation, Armonk, NY (US)

(72) Inventors: Mukta Ghate Farooq, Hopewell Junction, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 752 days.

(21) Appl. No.: 17/572,101

(22) Filed: Jan. 10, 2022

(65) Prior Publication Data

US 2023/0230901 A1    Jul. 20, 2023

(51) Int. Cl.
| | |
|---|---|
| *H01L 23/48* | (2006.01) |
| *H01L 21/768* | (2006.01) |
| *H01L 23/00* | (2006.01) |
| *H01L 23/528* | (2006.01) |
| *H01L 25/10* | (2006.01) |

(52) U.S. Cl.
CPC ...... *H01L 23/481* (2013.01); *H01L 21/76898* (2013.01); *H01L 23/5286* (2013.01); *H01L 24/13* (2013.01); *H01L 24/16* (2013.01); *H01L 24/81* (2013.01); *H01L 25/105* (2013.01); *H01L 2224/13147* (2013.01); *H01L 2224/16225* (2013.01); *H01L 2224/81801* (2013.01)

(58) Field of Classification Search
CPC .............. H01L 23/481; H01L 21/76898; H01L 23/5286; H01L 24/13
See application file for complete search history.

(56) References Cited

U.S. PATENT DOCUMENTS

| | | | |
|---|---|---|---|
| 6,281,576 B1 * | 8/2001 | Hakey | H01L 25/0657 |
| | | | 438/455 |
| 7,855,931 B2 | 12/2010 | LaBerge et al. | |
| 7,855,934 B2 | 12/2010 | LaBerge et al. | |

(Continued)

FOREIGN PATENT DOCUMENTS

| | | | | |
|---|---|---|---|---|
| CN | 113540059 A | | 10/2021 | |
| CN | 114121852 A | * | 3/2022 | ............. H01L 25/50 |

(Continued)

OTHER PUBLICATIONS

G. Sisto "IR-Drop Analysis of Hybrid Bonded 3D-ICs with Backside Power Delivery and u & n-TSVs" 2021 IEEE International Interconnect Technology Conference (IITC) Jul. 6-9, 2021 Online.

(Continued)

*Primary Examiner* — Laura M Menz
(74) *Attorney, Agent, or Firm* — Jeffrey Ingalls

(57) ABSTRACT

A semiconductor device includes an electronic circuit within a device layer; wherein the device layer is between a thin layer of wiring for signal connections having a first thickness and a thick layer of wiring for power having a second thickness, the second thickness being greater than the first thickness; a silicon layer above the device layer, the thin layer of wiring, and the thick layer of wiring; a first via connection from a top of the semiconductor device to the thin layer of wiring; a second via connection from the top of the semiconductor device to the thick layer of wiring; and a packaging substrate with a connection to the thick layer of wiring.

10 Claims, 16 Drawing Sheets

(56) References Cited

U.S. PATENT DOCUMENTS

| | | | | |
|---|---|---|---|---|
| 8,063,424 B2* | 11/2011 | Gebara | ................ | H10F 39/018 |
| | | | | 257/292 |
| 8,247,906 B2* | 8/2012 | Law | ................... | H01L 23/5286 |
| | | | | 257/776 |
| 8,304,863 B2* | 11/2012 | Filippi | ................. | H01L 25/0657 |
| | | | | 438/106 |
| 8,386,977 B2 | 2/2013 | Farooq et al. | | |
| 8,552,563 B2* | 10/2013 | Law | ....................... | H01L 24/05 |
| | | | | 257/776 |
| 8,716,856 B2 | 5/2014 | Tan et al. | | |
| 9,018,768 B2* | 4/2015 | Park | ................. | H01L 21/76898 |
| | | | | 257/692 |
| 9,064,717 B2* | 6/2015 | Purushothaman | ......................... | |
| | | | | H01L 21/76898 |
| 9,135,185 B2 | 9/2015 | Loh et al. | | |
| 9,170,948 B2 | 10/2015 | Loh et al. | | |
| 9,344,091 B2 | 5/2016 | Jayasena et al. | | |
| 9,564,420 B2 | 2/2017 | Yu et al. | | |
| 9,899,355 B2* | 2/2018 | Yuan | ..................... | H01L 25/167 |
| 10,020,254 B1* | 7/2018 | Bao | ................... | H01L 23/53228 |
| 10,068,899 B2* | 9/2018 | Melville | ................ | H10D 88/101 |
| 10,510,592 B2 | 12/2019 | Kao et al. | | |
| 10,636,739 B2 | 4/2020 | Beyne et al. | | |
| 10,886,224 B2* | 1/2021 | Gerousis | ................ | H10D 89/10 |
| 10,950,546 B1 | 3/2021 | Doornbos | | |
| 11,043,457 B2 | 6/2021 | Alur et al. | | |
| 11,049,844 B2* | 6/2021 | Bonam | ................... | H01L 25/00 |
| 11,158,580 B2* | 10/2021 | Sio | ...................... | H01L 21/4857 |
| 11,756,887 B2* | 9/2023 | Lanzillo | ................ | H01L 23/535 |
| | | | | 257/734 |
| 11,798,890 B2* | 10/2023 | Kung | ................ | H01L 23/5385 |
| 11,804,377 B2* | 10/2023 | Theil | ................ | H01L 21/31053 |
| 11,842,967 B2* | 12/2023 | Sio | ........................... | H01L 24/19 |
| 11,848,384 B2* | 12/2023 | Xie | ................... | H10D 30/6211 |
| 11,854,990 B2* | 12/2023 | Hu | ..................... | H01L 24/81 |
| 11,860,415 B2* | 1/2024 | Huang | ................ | G02B 6/4249 |
| 11,862,569 B2* | 1/2024 | Kirby | ..................... | H01L 24/05 |
| 11,908,791 B2* | 2/2024 | Mukesh | ................ | H01L 23/5226 |
| 12,057,371 B2* | 8/2024 | Xie | ....................... | H01L 23/535 |
| 12,266,612 B2* | 4/2025 | Hu | ..................... | H01L 23/5389 |
| 12,268,031 B2* | 4/2025 | Xie | .................. | H10D 30/0198 |
| 12,272,648 B2* | 4/2025 | Xie | .................. | H10D 84/0186 |
| 2010/0057411 A1* | 3/2010 | Li | ........................ | G06F 30/367 |
| | | | | 703/2 |
| 2010/0200992 A1* | 8/2010 | Purushothaman | ......................... | |
| | | | | H01L 21/76898 |
| | | | | 257/E23.145 |
| 2010/0252934 A1 | 10/2010 | Law et al. | | |
| 2011/0111560 A1* | 5/2011 | Purushothaman | ...... | H01L 25/50 |
| | | | | 438/109 |
| 2011/0115004 A1* | 5/2011 | Gebara | ................. | H10F 39/018 |
| | | | | 257/292 |
| 2011/0193199 A1* | 8/2011 | Filippi | ................. | H01L 25/0657 |
| | | | | 438/106 |
| 2012/0292763 A1* | 11/2012 | Filippi | ............... | H01L 21/76898 |
| | | | | 257/E21.597 |
| 2012/0292777 A1* | 11/2012 | Lotz | ..................... | H01L 23/5286 |
| | | | | 438/459 |
| 2012/0315753 A1* | 12/2012 | Farooq | ................... | H01L 24/03 |
| | | | | 438/653 |
| 2013/0187287 A1* | 7/2013 | Park | ................ | H01L 21/76831 |
| | | | | 257/774 |
| 2014/0264870 A1* | 9/2014 | Wu | .................... | H01L 23/53295 |
| | | | | 438/643 |
| 2015/0102497 A1* | 4/2015 | Park | ................. | H01L 21/76898 |
| | | | | 257/774 |
| 2015/0371938 A1* | 12/2015 | Katkar | ................ | H01L 25/0652 |
| | | | | 438/666 |
| 2016/0181201 A1* | 6/2016 | Yang | ................ | H01L 21/76898 |
| | | | | 257/737 |
| 2018/0053743 A1* | 2/2018 | Melville | ........... | H01L 21/76877 |
| 2019/0378821 A1* | 12/2019 | Costa | ................... | H01L 25/0657 |
| 2020/0176420 A1* | 6/2020 | Or-Bach | ............. | H01L 25/0657 |
| 2020/0266169 A1 | 8/2020 | Kang et al. | | |
| 2021/0118805 A1* | 4/2021 | Sio | ........................ | H01L 24/19 |
| 2021/0151345 A1* | 5/2021 | Liang | .................... | H10D 1/692 |
| 2021/0167018 A1* | 6/2021 | Hu | ..................... | H01L 23/49816 |
| 2021/0357565 A1* | 11/2021 | Fang | .................... | G06F 30/392 |
| 2021/0375829 A1* | 12/2021 | Or-Bach | ............... | H01L 25/50 |
| 2021/0375861 A1* | 12/2021 | Chung | ................ | H10D 84/038 |
| 2021/0407942 A1 | 12/2021 | Yu et al. | | |
| 2022/0045011 A1* | 2/2022 | Sio | ...................... | H01L 23/5385 |
| 2022/0068819 A1* | 3/2022 | Kirby | .................... | H10B 43/40 |
| 2022/0139806 A1* | 5/2022 | Park | ...................... | H01L 23/481 |
| | | | | 257/621 |
| 2022/0310485 A1* | 9/2022 | Hwang | ................ | H01L 23/522 |
| 2022/0367454 A1* | 11/2022 | Chung | ................. | H10D 30/62 |
| 2023/0090181 A1* | 3/2023 | Li | .......................... | H01L 24/16 |
| 2023/0103023 A1* | 3/2023 | Wagner | ............... | H01L 21/4857 |
| | | | | 257/399 |
| 2023/0110073 A1* | 4/2023 | Xie | .................... | H10D 84/0151 |
| | | | | 257/288 |
| 2023/0123423 A1* | 4/2023 | Gao | ...................... | H01L 23/645 |
| | | | | 257/428 |
| 2023/0132353 A1* | 4/2023 | Xie | ....................... | H01L 23/535 |
| | | | | 257/288 |
| 2023/0187397 A1* | 6/2023 | Or-Bach | ................ | H01L 24/80 |
| | | | | 257/690 |
| 2023/0187551 A1* | 6/2023 | Cheng | ................ | H10D 30/6757 |
| | | | | 257/369 |
| 2023/0207553 A1* | 6/2023 | Xie | ........................ | H10D 62/121 |
| 2023/0230901 A1* | 7/2023 | Farooq | ................ | H01L 23/5286 |
| | | | | 257/774 |
| 2023/0253322 A1* | 8/2023 | Choi | ..................... | H01L 23/481 |
| | | | | 257/369 |
| 2023/0326854 A1* | 10/2023 | Chu | ................... | H01L 23/5286 |
| | | | | 257/276 |
| 2023/0352407 A1* | 11/2023 | Park | ..................... | H10D 84/038 |
| 2023/0377949 A1* | 11/2023 | Syue | ................... | H01L 25/0657 |
| 2023/0387035 A1* | 11/2023 | Sio | ...................... | H01L 23/5385 |
| 2023/0420367 A1* | 12/2023 | Xie | ..................... | H10D 84/038 |
| 2024/0105612 A1* | 3/2024 | Xie | ..................... | H10D 88/101 |
| 2024/0105632 A1* | 3/2024 | Hu | ........................ | H01L 23/147 |
| 2024/0128239 A1* | 4/2024 | Song | ..................... | H01L 24/16 |
| 2024/0136290 A1* | 4/2024 | Kim | ..................... | H01L 23/481 |
| 2024/0186177 A1* | 6/2024 | Lanzillo | ............ | H01L 23/53238 |
| 2024/0194585 A1* | 6/2024 | Xie | ..................... | H01L 23/5226 |
| 2024/0215270 A1* | 6/2024 | Farooq | ................ | H01L 25/0657 |
| 2024/0243062 A1* | 7/2024 | Li | ......................... | H01L 23/5286 |
| 2024/0290688 A1* | 8/2024 | Kang | ..................... | H01L 21/76841 |
| 2024/0321631 A1* | 9/2024 | Li | ........................ | H01L 23/5329 |
| 2024/0379623 A1* | 11/2024 | Chen | .................. | H01L 21/76898 |
| 2024/0387393 A1* | 11/2024 | Hu | ..................... | H01L 23/49827 |
| 2024/0389366 A1* | 11/2024 | Or-Bach | .................. | H01L 24/08 |
| 2024/0421027 A1* | 12/2024 | Tong | .................... | H01L 25/50 |
| 2024/0429208 A1* | 12/2024 | Dutta | ..................... | H01L 24/08 |
| 2025/0008719 A1* | 1/2025 | Sung | ..................... | H10D 30/025 |
| 2025/0015047 A1* | 1/2025 | Badaroglu | ............ | H01L 23/481 |
| 2025/0038132 A1* | 1/2025 | La Tulipe | ........ | H01L 23/49822 |
| 2025/0096127 A1* | 3/2025 | Clevenger | ............ | H01L 23/5256 |
| 2025/0098288 A1* | 3/2025 | Haetty | ................. | H10D 84/811 |
| 2025/0140648 A1* | 5/2025 | Zhou | ................... | H10B 12/056 |
| 2025/0174549 A1* | 5/2025 | Mignot | ............ | H01L 23/53261 |

FOREIGN PATENT DOCUMENTS

| | | | | | |
|---|---|---|---|---|---|
| CN | 116368616 A | * | 6/2023 | ............. | H10B 12/50 |
| CN | 117581366 A | * | 2/2024 | | |
| CN | 117976652 A | * | 5/2024 | ......... | H01L 21/4846 |
| CN | 118402067 A | * | 7/2024 | ......... | H10D 30/0198 |
| CN | 118412338 A | * | 7/2024 | ............. | H01L 24/82 |
| CN | 221264365 U | * | 7/2024 | ............. | H10D 64/035 |
| CN | 118476022 A | * | 8/2024 | ......... | H10D 30/0198 |
| CN | 118486648 A | * | 8/2024 | ............ | H01L 23/481 |
| CN | 118588637 A | * | 9/2024 | ....... | H01L 21/76895 |
| CN | 118943101 A | * | 11/2024 | ....... | H01L 21/76898 |
| CN | 118969773 A | * | 11/2024 | ............ | H01L 22/32 |
| CN | 222071939 U | * | 11/2024 | | |
| CN | 119133087 A | * | 12/2024 | ....... | H01L 21/76898 |
| DE | 112022005321 T5 | * | 8/2024 | ......... | H10D 30/0198 |
| DE | 112022005536 T5 | * | 10/2024 | ......... | H10D 30/0198 |

(56) References Cited

FOREIGN PATENT DOCUMENTS

| | | | | |
|---|---|---|---|---|
| DE | 112022005536 B4 | * | 3/2025 | ........... H10D 86/471 |
| EP | 3324436 B1 | | 8/2020 | |
| EP | 4273924 A2 | * | 11/2023 | ......... H01L 23/5286 |
| EP | 4510176 A1 | * | 2/2025 | ............. H01L 21/56 |
| JP | 5461327 B2 | | 4/2014 | |
| JP | 2022540468 A | * | 9/2022 | ......... H01L 25/0652 |
| JP | 2023097349 A | * | 7/2023 | ......... H10D 30/0198 |
| JP | 2024509989 A | * | 3/2024 | ............ H10D 88/00 |
| JP | 2025500189 A | * | 1/2025 | ......... H10D 30/0198 |
| KR | 102094473 B1 | * | 3/2020 | ............ H01L 23/50 |
| KR | 20200037444 A | | 4/2020 | ......... H01L 25/0657 |
| KR | 20230082048 A | * | 6/2023 | ............. H01L 24/11 |
| TW | I521663 B | | 2/2016 | |
| WO | 2010/047228 A1 | | 4/2010 | |
| WO | WO-2023046566 A2 | * | 3/2023 | ........... H10D 84/834 |
| WO | WO-2023069912 A1 | * | 4/2023 | ............. H01L 25/50 |
| WO | WO-2023111749 A1 | * | 6/2023 | ......... H10D 30/0198 |
| WO | WO-2023126710 A1 | * | 7/2023 | ......... H10D 30/0198 |
| WO | WO-2023131505 A1 | * | 7/2023 | ......... H01L 23/5226 |

OTHER PUBLICATIONS

IP.com "TSV Via Last from Wafer Device Side" An IP.com Prior Art Database Technical Disclosure. May 11, 2016.
International Search Report and Written Opinion of the International Searching Authority; PCT/EP2022/086623; dated Apr. 14, 2023; 10 pages; European Patent Office.

* cited by examiner

US 12,431,408 B2

TSV AND BACKSIDE POWER DISTRIBUTION STRUCTURE

BACKGROUND

The exemplary embodiments described herein relate generally to semiconductor device design and integrated circuit design, and more specifically, to a TSV and backside power distribution structure.

BRIEF SUMMARY

In one aspect, a semiconductor device includes an electronic circuit within a device layer; wherein the device layer is between a thin layer of wiring for signal connections having a first thickness and a thick layer of wiring for power having a second thickness, the second thickness being greater than the first thickness; a silicon layer above the device layer, the thin layer of wiring, and the thick layer of wiring; a first via connection from a top of the semiconductor device to the thin layer of wiring; a second via connection from the top of the semiconductor device to the thick layer of wiring; and a packaging substrate with a connection to the thick layer of wiring.

In another aspect, a via within an electronic structure is distributed through a first silicon, a first back end of line, a second silicon, and a second back end of line.

In another aspect, a method of forming a semiconductor device includes forming at least one device in a first silicon wafer, the first silicon wafer having back end of line interconnects and a super via; bonding a second silicon wafer over the back end of line interconnects of the first silicon wafer to form a first wafer structure; flipping the first wafer structure, and thinning the first silicon wafer; forming backside interconnects at a backside of the at least one device; bonding a temporary handler over the backside interconnects to form a second wafer structure; flipping the second wafer structure, and thinning the second silicon wafer; forming a first through silicon via through the thinned second silicon wafer to connect to the back end of line interconnects; and forming a second through silicon via through the thinned second silicon wafer to connect to the super via and to the backside interconnects.

BRIEF DESCRIPTION OF THE SEVERAL VIEWS OF THE DRAWINGS

The foregoing and other aspects of exemplary embodiments are made more evident in the following Detailed Description, when read in conjunction with the attached Drawing Figures, wherein.

DETAILED DESCRIPTION

The term "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

Described herein is a TSV and backside power distribution structure, and a method and structure of forming a TSV connection to connect two BEOL regions and two Si regions with BSPDN.

A grind side or back side power distribution network (BSPDN) relies on efficient and optimal power delivery to the backside network closest to the devices. This reduces IR droop such as in traditional builds where C4s feed large BEOL vias, then those lead to fine BEOL vias, MOL, and finally devices.

Figure 1:
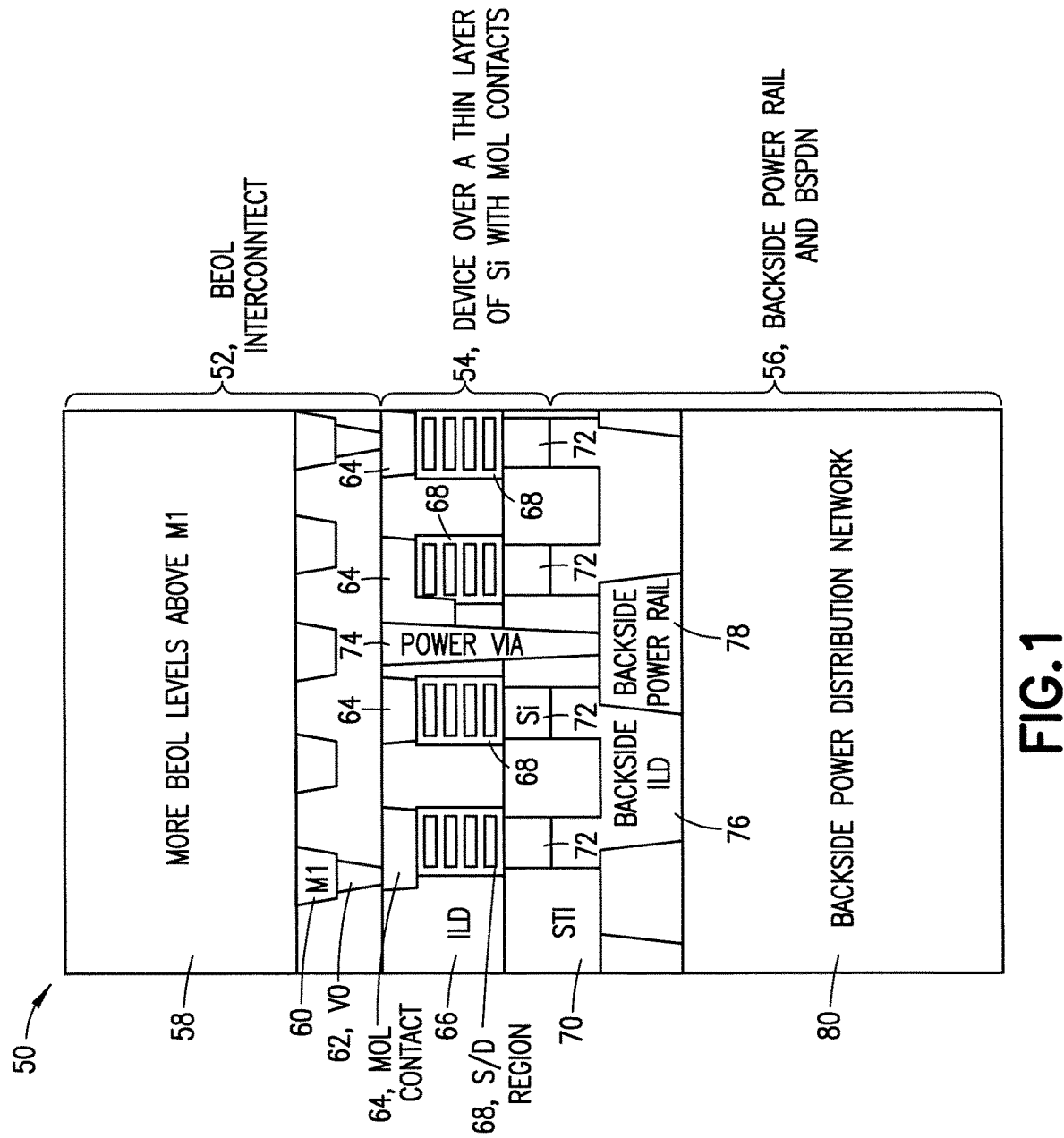
FIG. 1 is a semiconductor device.

FIG. 1 is a semiconductor device 50. The semiconductor device 50 includes a BEOL interconnect layer 52 at the frontside of the semiconductor device 50, a device over a thin layer of Si 72 with MOL contacts 64 (collectively layer 54), where the device includes S/D region 68, and a backside power rail 78 and BSPDN 80 (collectively layer 56). The BEOL interconnect layer 52 includes M1 60 and more BEOL levels above M1 (58), as well as V0 62 which connects the BEOL interconnect layer 52 to the MOL contact 64 of the device layer 54. The S/D region 68 and MOL contacts 64 are encapsulated within ILD 66. Between the ILD 66 and a top surface of the backside power rail 78 is STI 70. Backside ILD 76 abuts backside power rail 78. The power via 74 connects the backside power rail 78 to the BEOL interconnect layer 52. The semiconductor device as described herein (100, 100-1, 100-2) improves the device 50 shown in FIG. 1.

Figure 2:
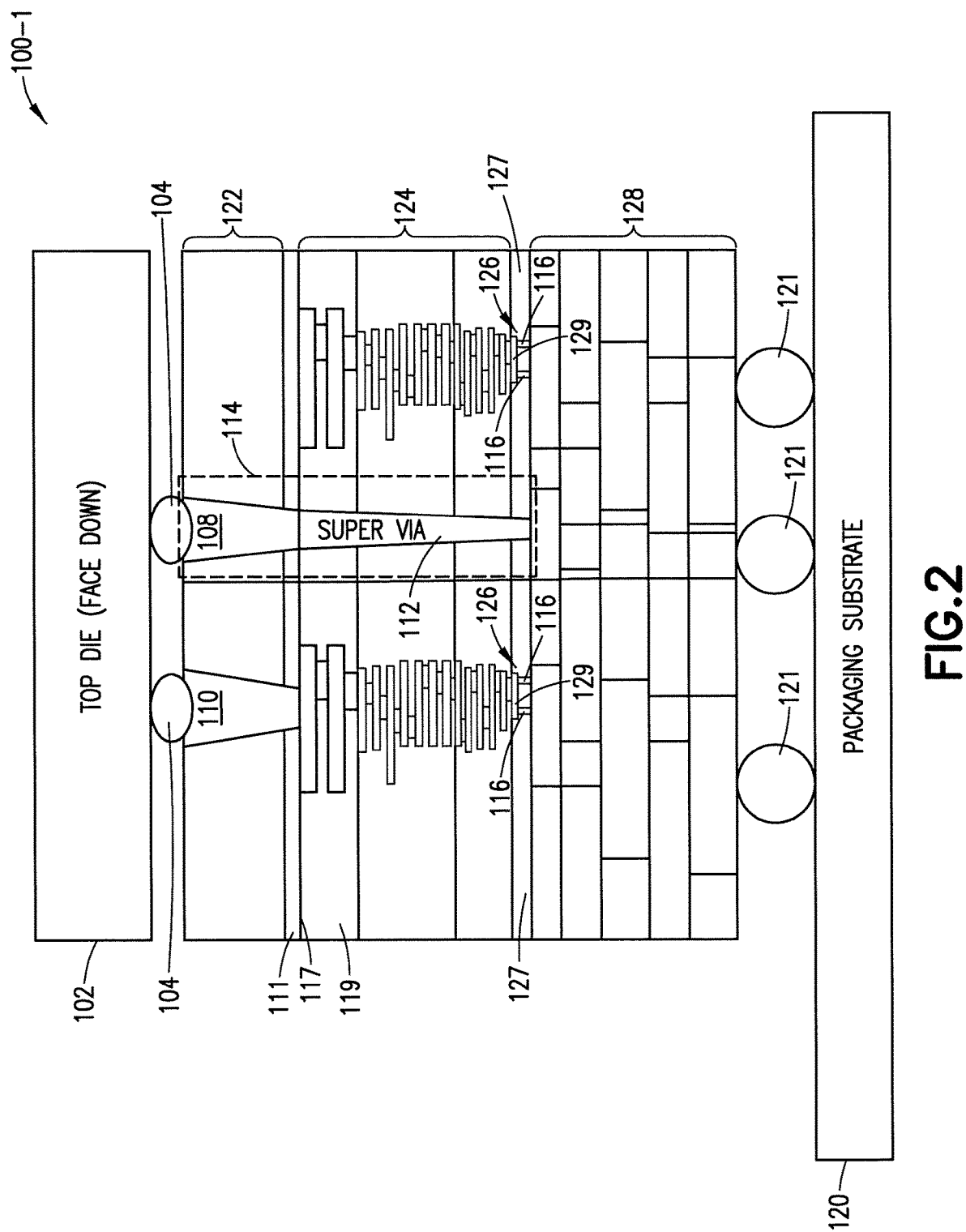
FIG. 2 is a side view of an embodiment of a semiconductor device, based on the examples described herein.

FIG. 2 is a side view of an embodiment of a semiconductor device 100-1, based on the examples described herein. The semiconductor device 100-1 includes a packaging substrate 120 with connection 121, at least one chip 129 within a device layer 126 between a thin stack 124 on one side and thick stack 128 on other side, and a thick silicon layer 122 above the device 126 and wiring layers (124, 128). In the herein described stacking configuration, a chip 102 is added above the via (108, 112) going through the entire chip 100-1 (which is otherwise expensive in process and area). There are connections from the top of the chip 102 through the top thick silicon 122 to the wiring level (124, 128), where the via connections comprise A) a short via (108, 110) to the top 117 of thin wiring 124, and B1) a tall via 112 to backside thick wiring, or B2) a tall via stack (114) including a super via 112 to backside thick wiring 128. The top surface of the tall via stack 114 (e.g. the top surface of the power TSV 108) may be flush with the top surface of the silicon layer 122 near where the connection 104 is made with the top die 102. The bottom surface of the tall via stack 114 (e.g. the bottom surface of the super via 112) may be flush with the bottom surface of the silicon layer 127 near where the bottom surface of the super via 112 connects with thick BEOL layer 128. The structure 100-1 includes a top die 102 and a connection 104 to the vias (108, 110, 112, 114) in the lower die. The layer 111 is a thin oxide layer used to bond the chip 129 to the silicon 122. The connection of 110 and 108 is made through this oxide layer 111 to the top metal level 119 in the stack 124.

As further shown in FIG. 2, the semiconductor device 100-1 includes a thin silicon layer 127 including at least one nano TSV 116. The device layer 126 includes at least one device 129, for example connected to the at least one nano TSV 116.

Figure 3:
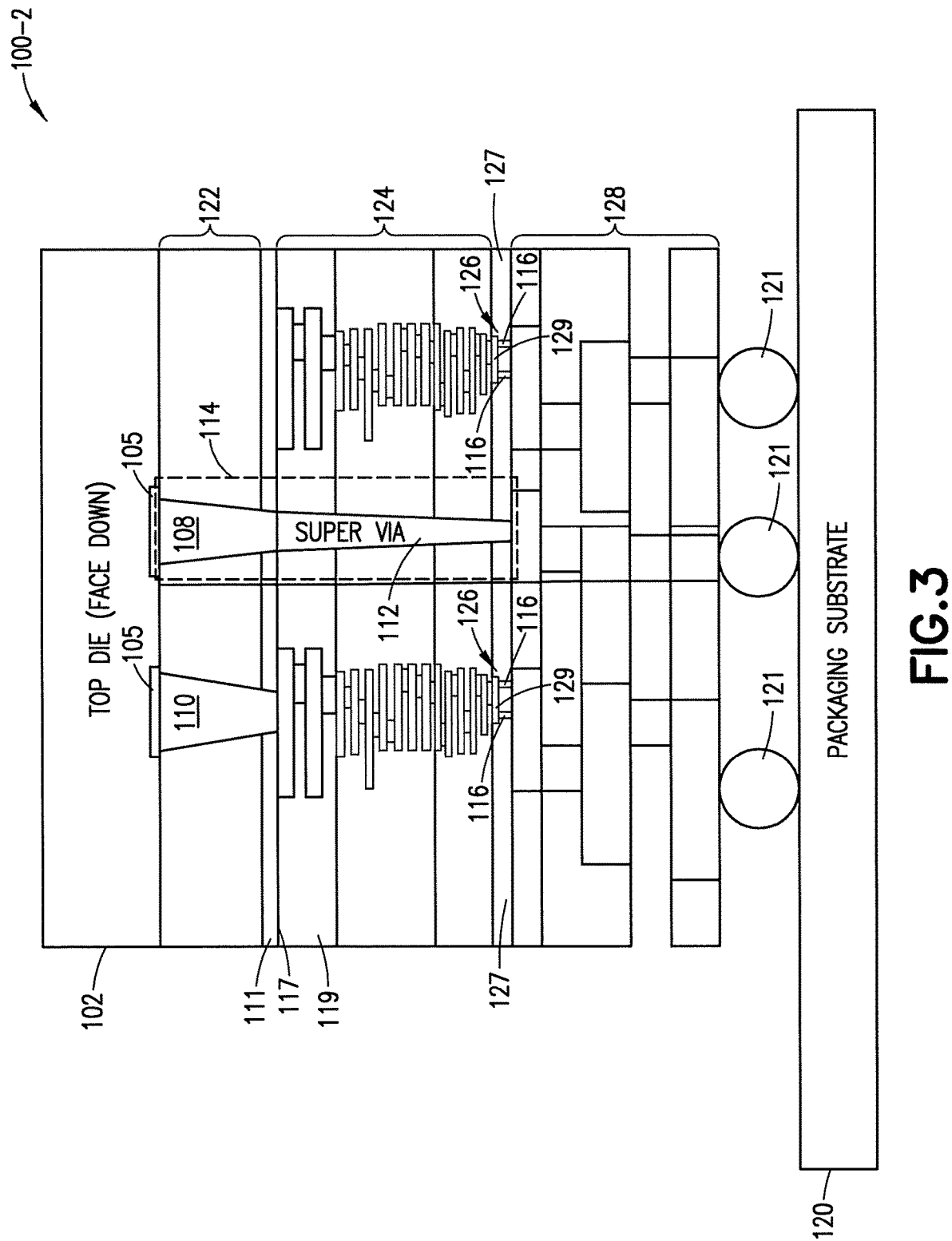
FIG. 3 is an side view of another embodiment of a semiconductor device, based on the examples described herein.

FIG. 3 is a side view of another embodiment of a semiconductor device 100-2, based on the examples described herein. The semiconductor device 100-2 shown in FIG. 3 is similar to the semiconductor device 100-1 shown in FIG. 2, where in FIG. 3 the connection 105 that joins the top die 102 to the vias (108, 110, 112, 114) in the lower die and the silicon layer 122 uses a Cu hybrid bond structure.

The process for forming the herein described structure includes 1) forming devices over a first substrate with BEOL interconnects, 2) bonding a first carrier wafer over the BEOL interconnects, 3) flipping the wafer, and thinning the first substrate, 4) forming backside interconnects at a backside of the devices, 5) bonding a second carrier wafer over the backside interconnects, 6) flipping the wafer, and thinning the first carrier wafer, 7) forming a short TSV through the thinned first carrier wafer to connect to the BEOL interconnects, and 8) forming a tall via (including a TSV) through the thinned first carrier wafer, BEOL levels, and first substrate, to connect to backside interconnects.

Figure 4:
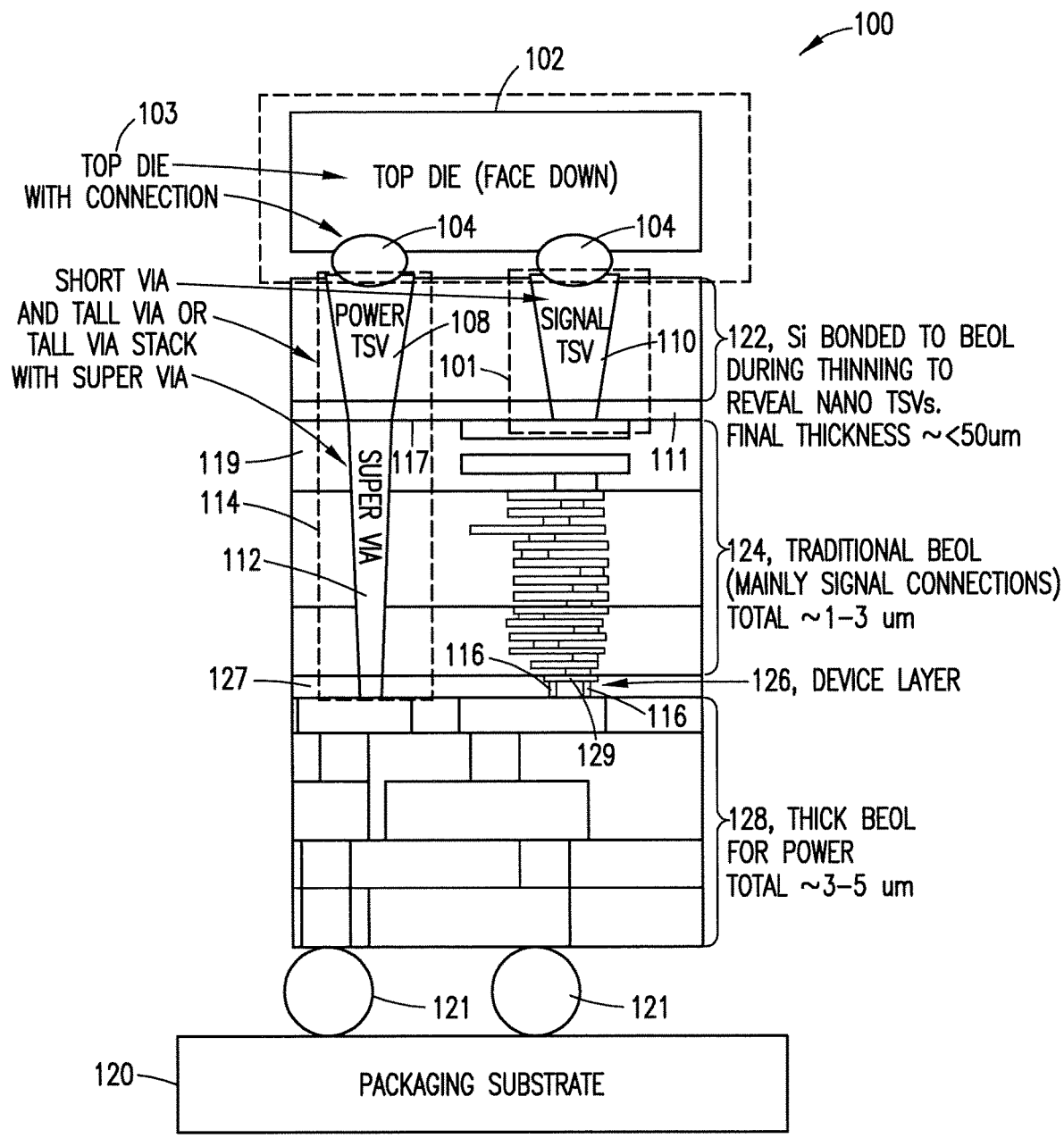
FIG. 4 illustrates different configurations of vias for connecting a top die to a thick BEOL for power.

FIG. 4 is a side view of a portion of a TSV and backside power distribution 100, structure illustrating different configurations of vias for connecting a top die 102 to a thick BEOL 128 for power. The structure 100 includes a top die 102 with a connection (104) to a silicon layer 122, the silicon layer 122 including a signal TSV 110 and either a power TSV 108 or a portion of a tall via 114. Connection 104 may be a C4 or Cu connection.

As depicted in FIG. 4, the structure 100 includes a top die 102 with connection 104 (collectively 103) to the power TSV 108 and the signal TSV 110. The structure 100 includes the signal TSV 110 and the power TSV 108 with a super via 112 embodiment. The structure 100 includes a via connection from the top of the chip through top thick silicon to the wiring level. In particular, the structure 100 includes a short via (101, 110) to the top 117 of thin wiring 124 and a tall via 112 to backside thick wiring 128, or a tall via stack 114 including a super via 112 to backside thick wiring 128. In some examples, the super via 112 is longer than the power TSV 108 and the signal TSV 110. In other examples, the super via 112 is not longer than the power TSV 108 or the signal TSV 110. The length of the super via 112 has no specific relation to the power TSV 108 or the signal TSV 110. The super via 112 has a relation to the thin BEOL stack 124 because the total depths of the super via 112 and the thin BEOL stack 124 are similar, but need not be identical.

The structure 100 also includes a packaging substrate 120 with a connection 121 to the structure 100. As shown, the packaging substrate 120 is connected to the thick wiring 128. The chip 100 includes a device layer 126 between the thin stack 124 on one side and a thick stack 128 on the other side. There is a thick silicon layer 122 above the device layer 126 and the wiring layers (124, 128). Nano TSVs 116 connect the device layer 126 and the thin layer 124 to the thick layer 128.

The silicon (Si) layer 122 is bonded to the back end of line (BEOL) layer 124 during thinning to reveal the nano TSVs (116). The final thickness of the Si layer 122 is approximately less than 50 um. The thin stack 124, or the BEOL layer 124 includes mainly signal connections and is in total approximately 1-3 um thick. The thick stack 128, or the thick BEOL 128 is in total approximately 3-5 um thick. The nano TSVs 116 are included within a second silicon layer 127.

Figure 5:
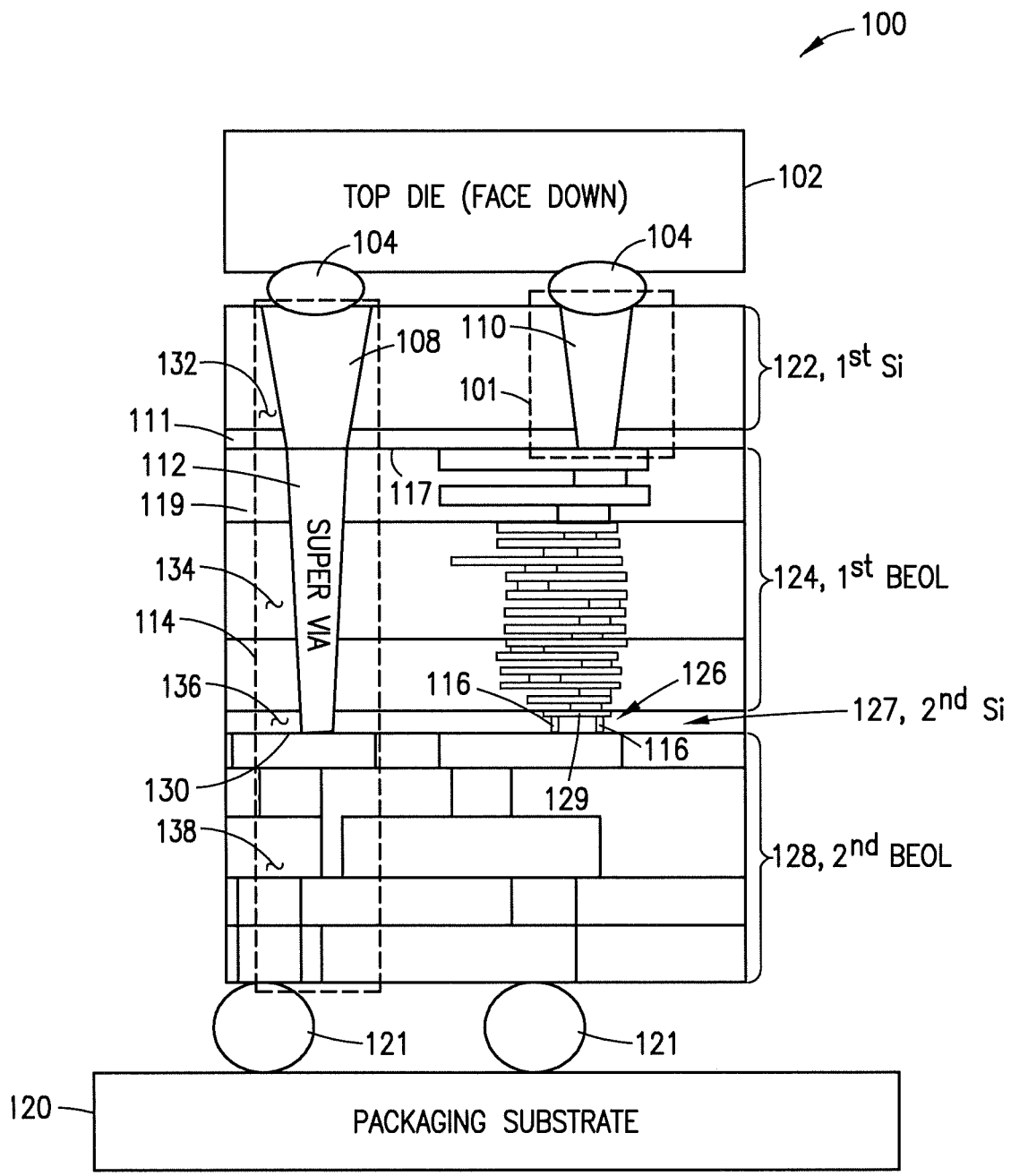
FIG. 5 is a side view illustrating various layers of a TSV and backside power distribution structure.

FIG. 5 is a side view illustrating the layers of a TSV and backside power distribution structure 100. Shown in FIG. 5 is an embodiment structure of a via (108, 112, and/or 114, with further reference to FIG. 4) that travels through a first silicon 122, a first BEOL 124, a second silicon 127, and a second BEOL 128. The first BEOL 124 is thinner than the second BEOL 128. Wiring within the first BEOL 124 may also be thinner than the wiring within the second BEOL 128. The first Si 122 is thicker than the second Si 127. The second BEOL 128 terminates in a C4 or Cu interconnection (121) to a packaging substrate 120. The via (108, 112, 114) is filled with Cu. The via 110 may also be filled with Cu. The via (112, 114) lands on a Cu level 130 in the 2nd BEOL 128. The via (108, 112, 114) is etched through a first Si 122, followed by a first BEOL 124, followed by a second Si 127, followed by a second BEOL 128. Keep out zones (132, 134, 136, 138) are created before the via (108, 112, 114) is etched, in the first silicon 122, the first BEOL 124, the second silicon 127, and the second BEOL 128. The keep out zones (KOZs) may be defined as the entire area through which the TSV travels, i.e. the keep out zone is created in anticipation of the TSV, and when the TSV is formed, the TSV must be within that area. In some examples, a KOZ may be defined as the boundary area between the TSV and the nearest feature e.g. a BEOL wire. The via (108, 112, 114) draws power from the package 120. Further described herein is a method of forming the structure 100 having the aforementioned aspects.

Accordingly, described herein is a structure of a via (108, 112, 114) that travels through a first silicon 122 and a first BEOL 124, where the via (108, 110, 112, 114) enables connection between a top die 102 and the first BEOL 124.

Figure 6A:
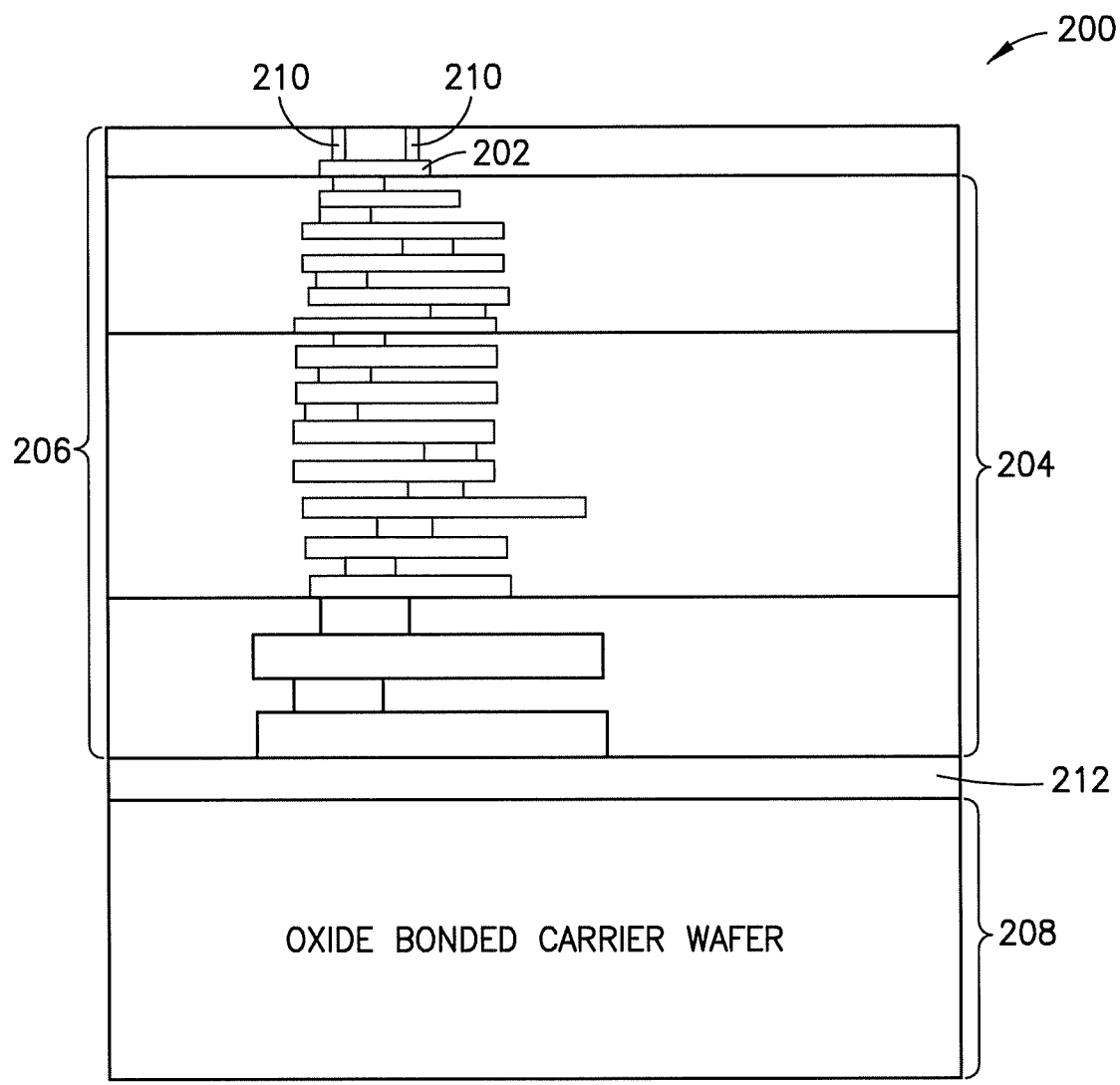
FIG. 6A is a schematic illustrating a first portion of a process flow to fabricate an electronic structure.
Figure 6B:
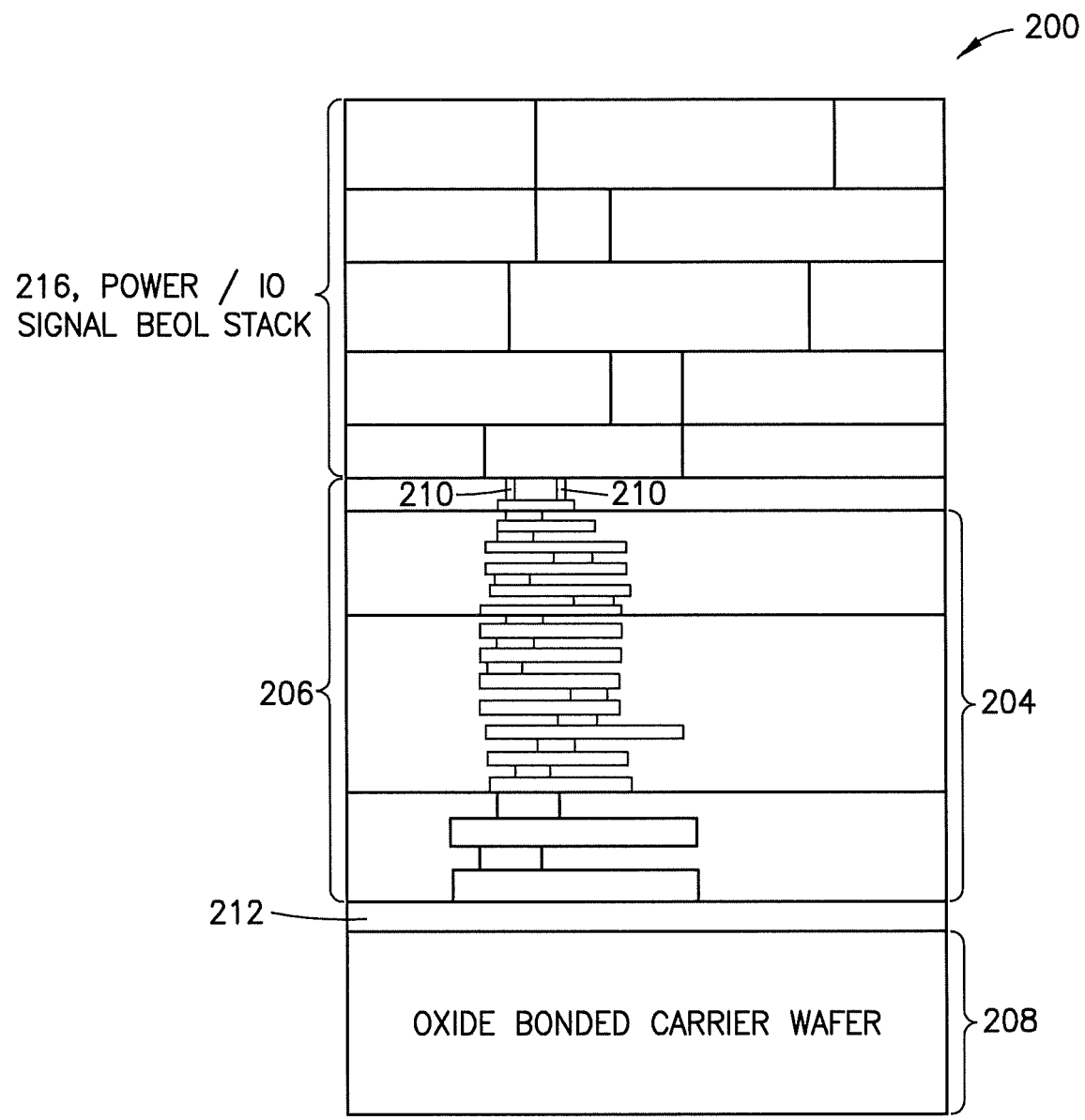
FIG. 6B is a schematic illustrating a second portion of a process flow to fabricate the electronic structure.

FIG. 6A is a schematic illustrating a first portion of a process flow 200 to fabricate an electronic structure, including estimation of a power via. The first part of the process is to build devices (such as 202) and a thin BEOL 204. The second part of the process is to join the base wafer 206 to the carrier wafer 208, using a bond 212 such as an oxide bond or a Cu/hybrid bond. The third part of the process is to thin the base wafer 206 to expose the nano-TSVs (210). FIG. 6B is a schematic illustrating a second portion of a process flow 200 to fabricate the electronic structure, including estimation of a power via. The fourth part of the process includes building a power/IO signal BEOL stack 216, that includes signals going off the die.

Figure 7A:
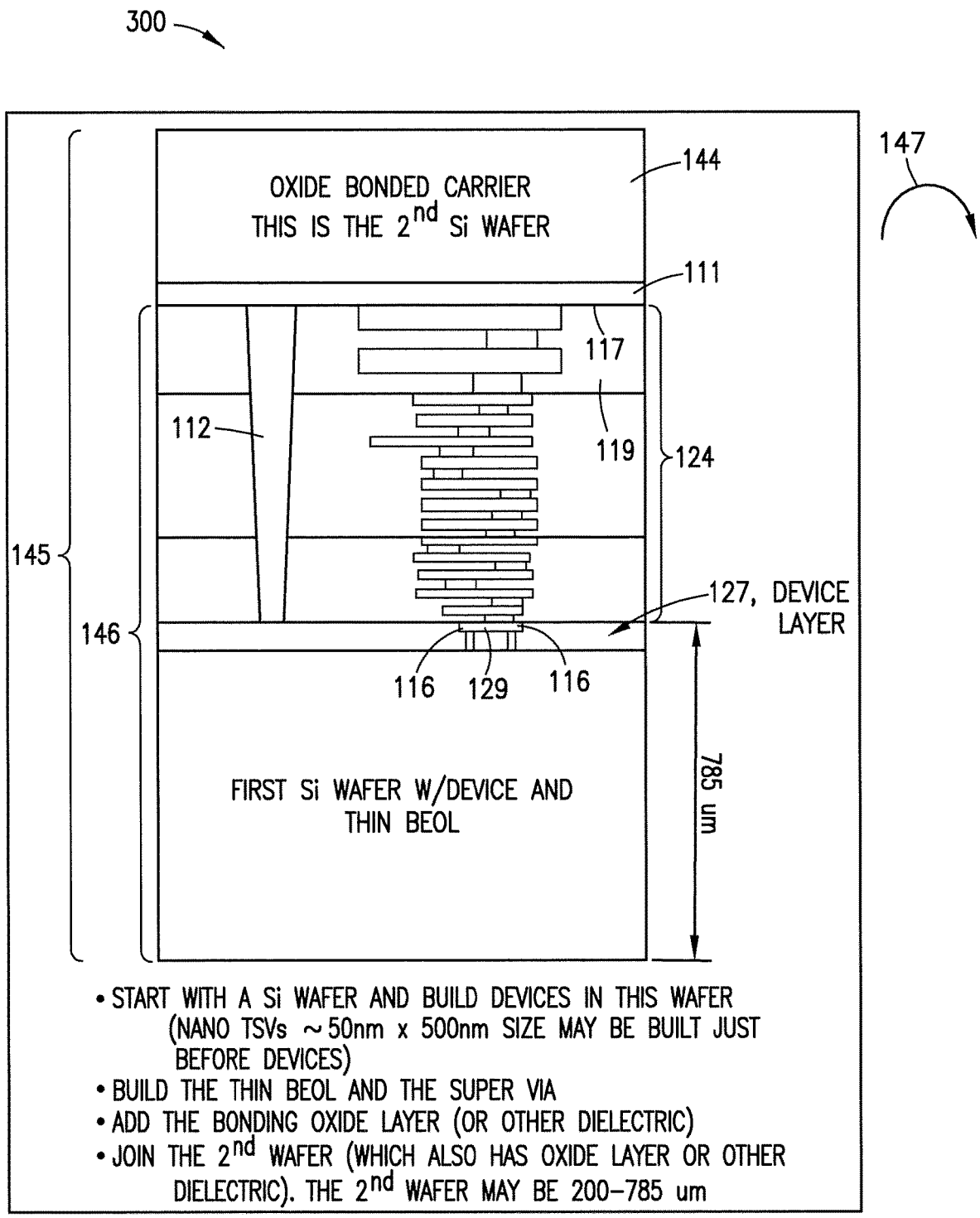
FIG. 7A is a portion of a method to fabricate a TSV and backside power distribution structure.

FIG. 7A is a portion of a method 300 to fabricate a TSV and backside power distribution structure. The method proceeds by starting with a Si wafer 146 and building devices (e.g. 129) in the wafer 146. The nano TSVs 116 having a size of approximately 50 nm×500 nm may be built just before building the thin devices 129. Then, build the thin BEOL 124 and the super via 112 within the wafer 146. Then add the bonding oxide layer 144 (or other dielectric) which is approximately 200 um in length, which functions as a second wafer. The oxide layer 144 is preferably new. The wafer 144 is joined to the thin BEOL 124 of the wafer 146 using oxide layer 111. The second wafer 144 may be 200-785 um. The entire structure 145 is flipped (147), resulting in, after thinning the wafer 146, the structure 150 shown in FIG. 7B (the structure 150 may also including the temp handler 140 as shown in FIG. 7C).

Figure 7B:
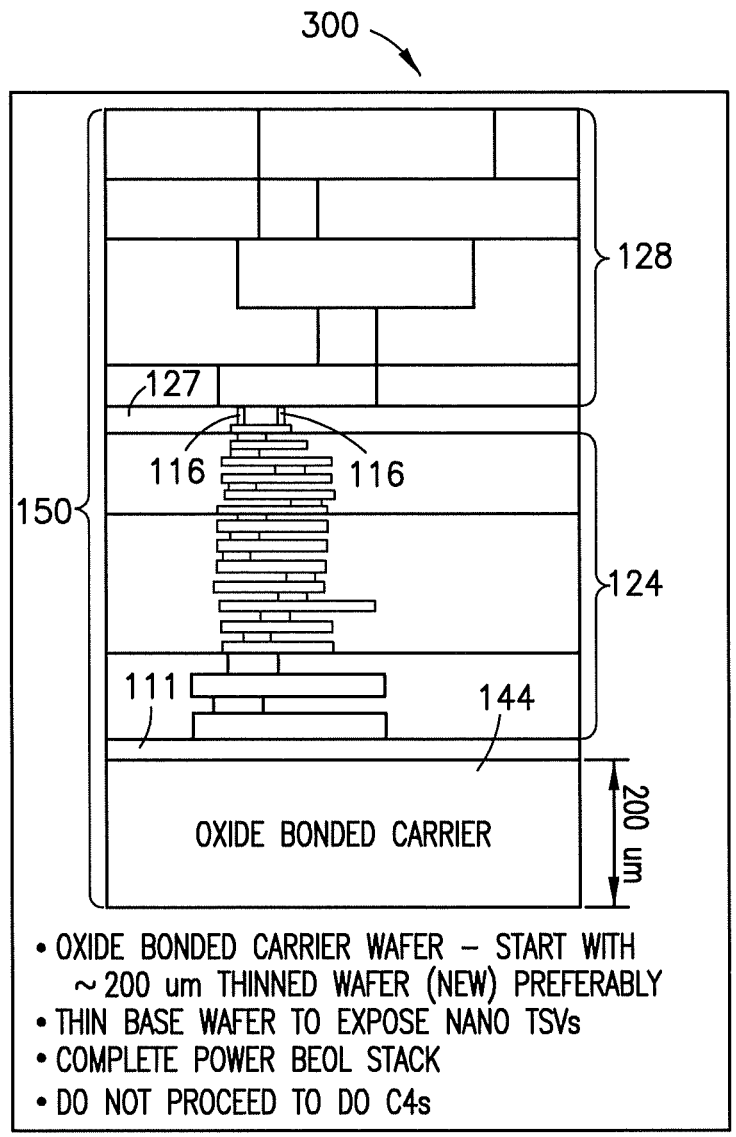
FIG. 7B is a portion of the method to fabricate a TSV and backside power distribution structure.

FIG. 7B is a portion of the method 300 to fabricate a TSV and backside power distribution structure. The base wafer 146 is thinned to expose the nano TSVs (116), resulting in the silicon layer 127. Further, the power BEOL stack 128 is completed within the wafer 150, where the power BEOL stack 128 is joined to the silicon layer 127 created after thinning the wafer 146. At this stage of the process 300, the C4s are not connected.

Figure 7C:
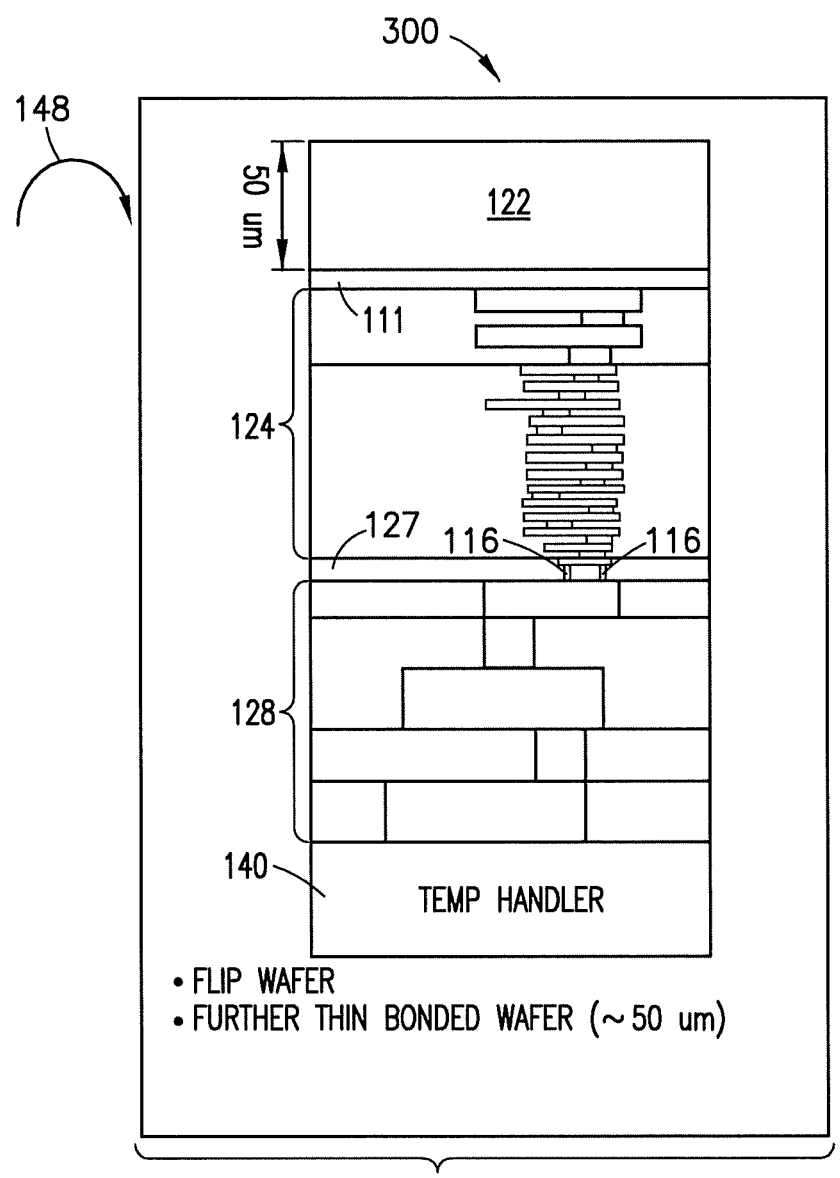
FIG. 7C is a portion of the method to fabricate a TSV and backside power distribution structure.

FIG. 7C is a portion of the method 300 to fabricate a TSV and backside power distribution structure. In FIG. 7C, the wafer 150 is flipped 148. The bonded wafer 144 is further thinned to be approximately 50 um, resulting in the silicon layer 122. As shown in FIG. 7C, a temp handler 140 is connected to a side of the thick BEOL for power layer 128 (which is in an example performed as part of the portion of the method 300 shown in FIG. 7B prior to flipping 148 the structure 150). Even though the super via 112 is not shown in FIG. 7B and FIG. 7C, the super via 112 is within the thin BEOL 124 of FIG. 7B and FIG. 7C as it was constructed during the portion of the method 300 as depicted in FIG. 7A.

Figure 7D:
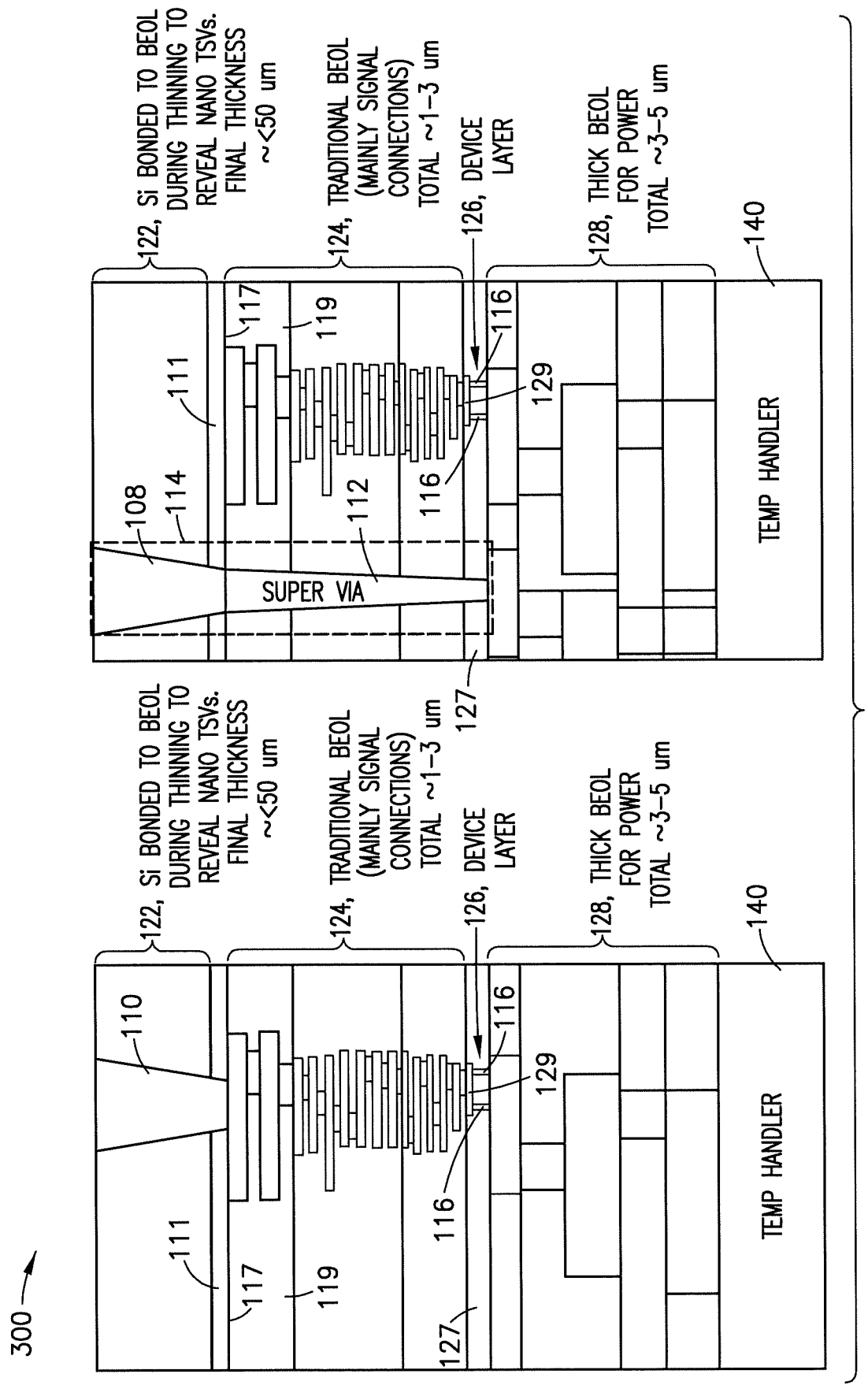
FIG. 7D is a portion of the method to fabricate a TSV and backside power distribution structure.

FIG. 7D is a portion of the method 300 to fabricate a TSV and backside power distribution structure. FIG. 7D shows TSV integration, where the TSVs (108, 110) are built. As for example shown in FIG. 7A, the super via 112 may be built before this step. In other words, during the build up of the traditional BEOL 124, (just before or just after or during), the via 112 may be built and kept ready. This is the preferred option so that the two vias 110 and 108 are built during the same step, and they land on different parts of the region 119, and make the connections as required.

Building the TSVs (108, 110, 112) include applying an etch, insulation, liner, plate, and CMP. If needed, an RDL is completed to receive a top die 102. A UBM is also completed to receive the top die 102. The examples described herein relate to a via type 1 and a via type 2. The via type 1 includes signal connections between the top die 102 and bottom die. The via type 1 includes via 110. The via type 2 includes power vias to deliver power to the top die 102. The via type 2 includes via 108 and super via 112, as well as via stack 114.

Figure 7E:
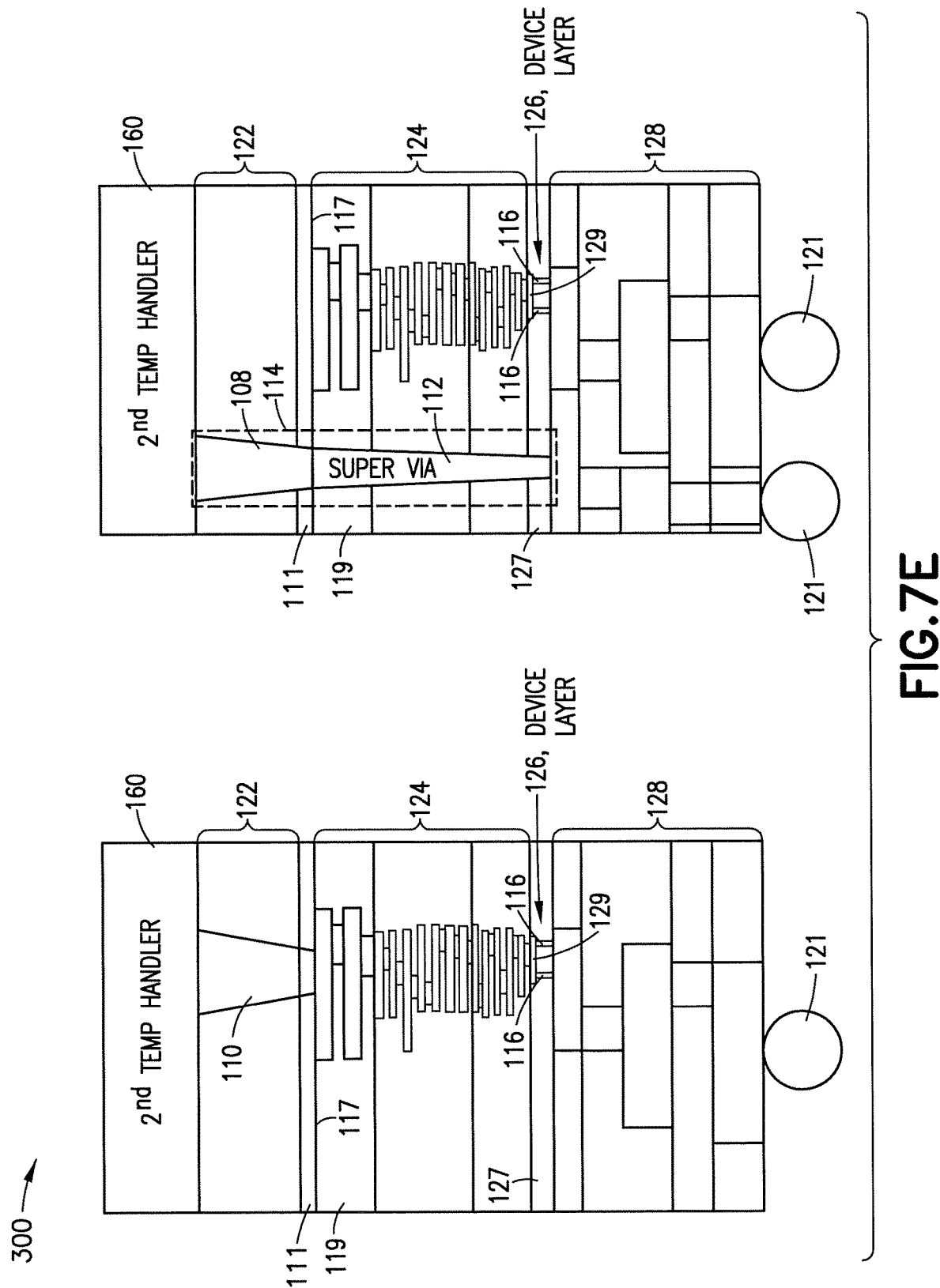
FIG. 7E is a portion of the method to fabricate a TSV and backside power distribution structure.

FIG. 7E shows a portion of the method 300 to fabricate the TSV and backside power distribution structure. In FIG. 7E, a second temp handler 160 is attached to the silicon layer 122, the first temp handler 140 is removed from the thick BEOL layer 128, and C4 bumps 121 are attached to the thick BEOL layer 128.

Figure 7F:
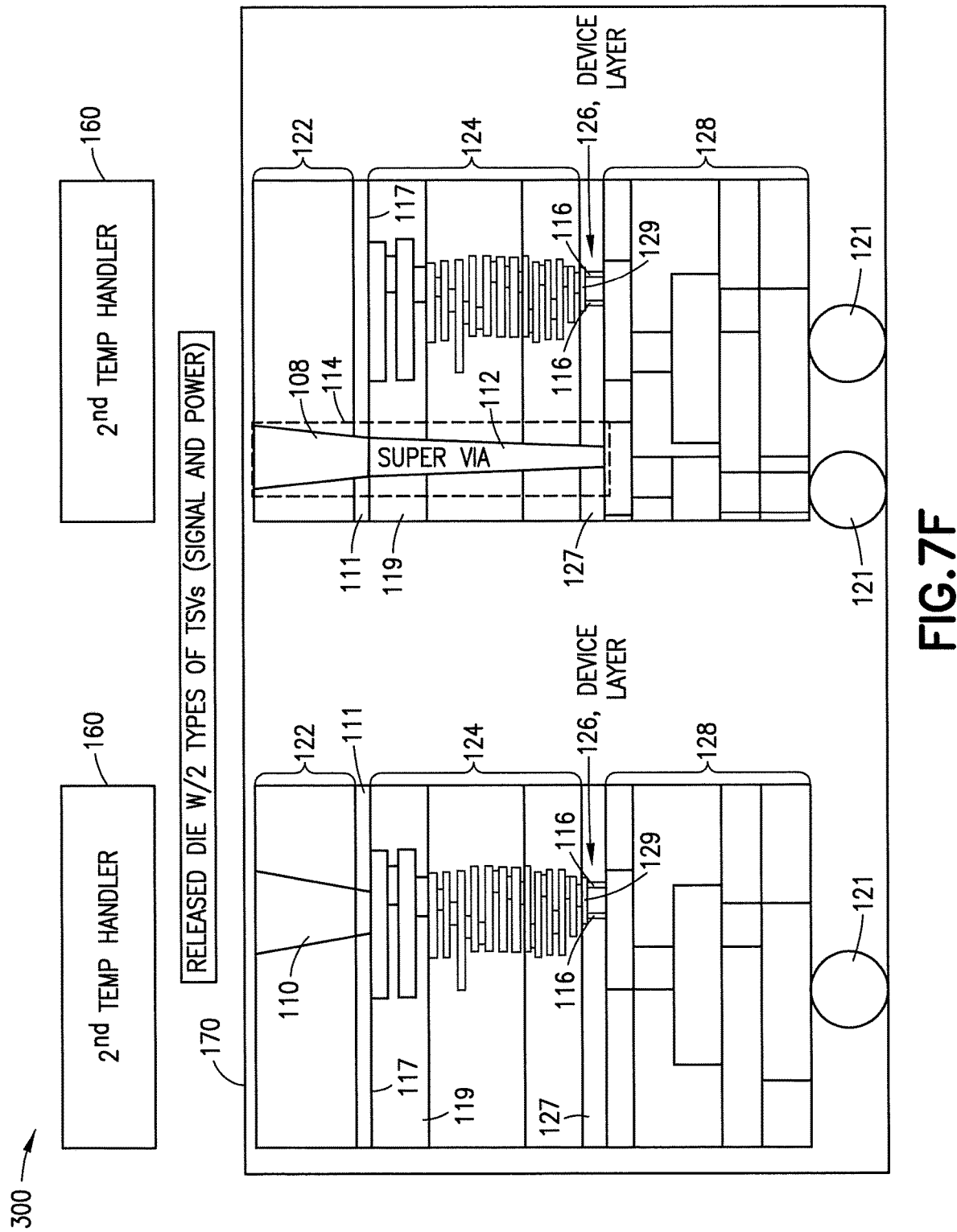
FIG. 7F is a portion of the method to fabricate a TSV and backside power distribution structure.

FIG. 7F shows a portion of the method 300 to fabricate the TSV and backside power distribution structure. The wafer 170 is diced while on the second temp handler 160. Then, the wafer 170 is released so that the die may be picked for assembly. As shown in FIG. 7F, the released die 170 has two types of TSVs, namely a signal TSV which includes TSV 110 and power TSVs which include TSV 108 and super via 112.

Figure 7G:
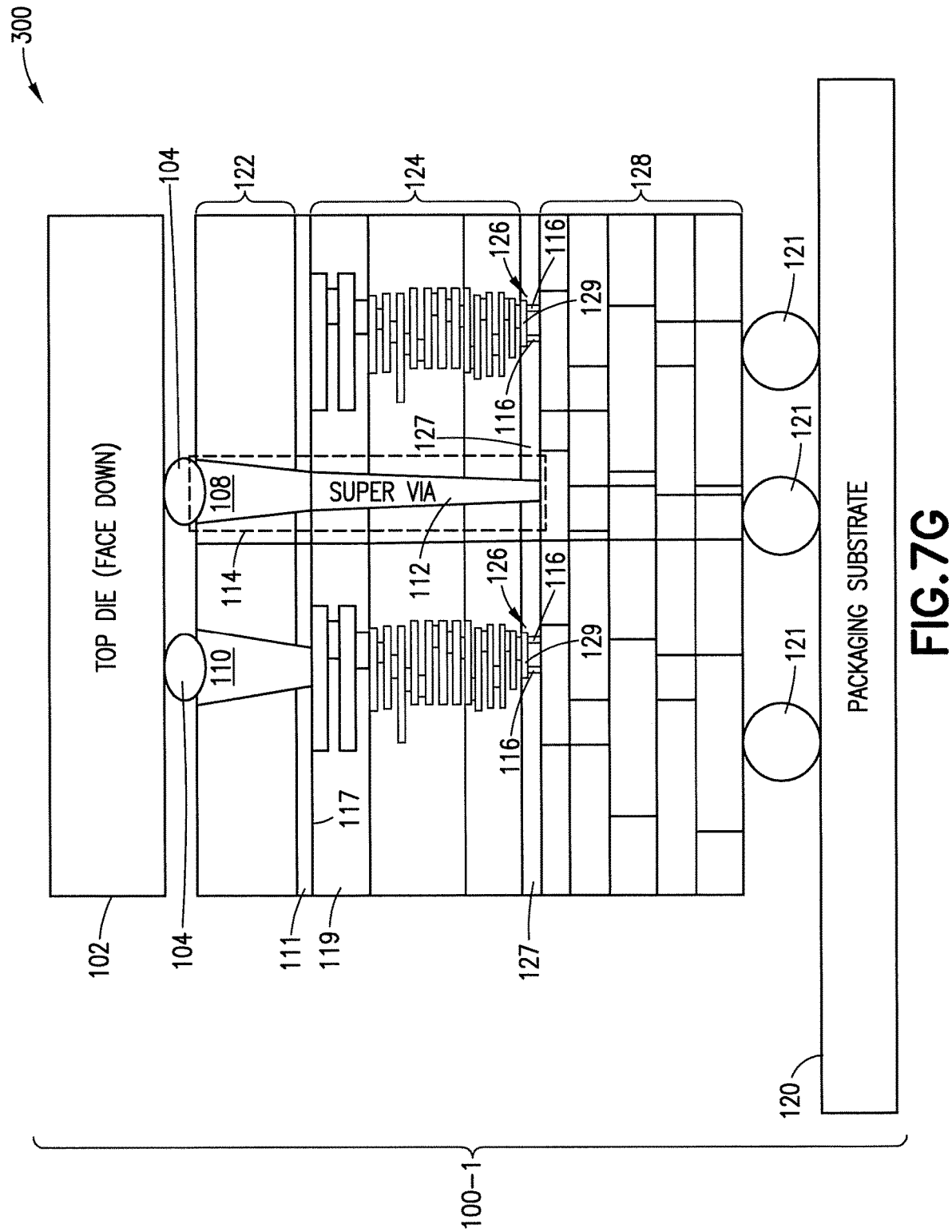
FIG. 7G is a portion of the method to fabricate a TSV and backside power distribution structure.

FIG. 7G is a portion of the method 300 to fabricate a TSV and backside power distribution structure 100-1. FIG. 7G shows bonding/assembly with solder bonding (C4) or Cu pillar and solder bonding (collectively item 104) between the top die 102 and the thinned die. In particular, bonding 104 is between the top die 102 and the silicon layer 122, where the bonding 104 is such that a surface of the top die 102 is connected to the power TSV 108 and the signal TSV 110. FIG. 7G further shows solder bonding (C4) or Cu pillar and solder bonding (collectively item 121) between thinned middle die and the packaging substrate 120. As shown the bonding 121 joins the thick BEOL for power 128 to the packaging substrate 120. The preferred order is to bond the top die 102 to the thinned die (e.g. 122, 124) first, followed by joining the structure (through e.g. thick BEOL 128) to the packaging substrate 120.

Figure 7H:
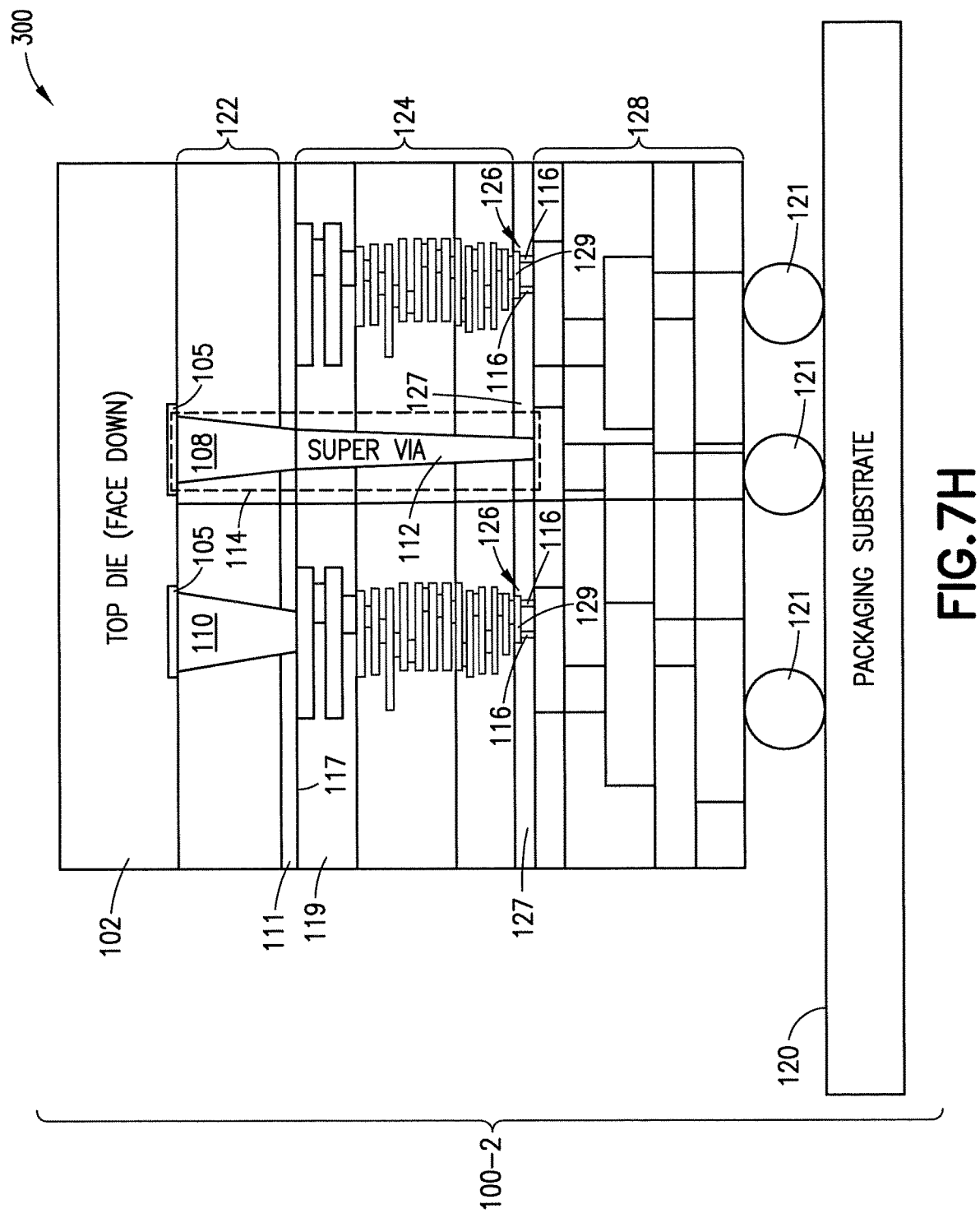
FIG. 7H is a portion of the method to fabricate a TSV and backside power distribution structure.

FIG. 7H is a portion of the method 300 to fabricate a TSV and backside power distribution structure 100-2. FIG. 7H represents an alternative to FIG. 7G. FIG. 7H shows bonding/assembly with Cu or Cu hybrid bonding (collectively item 105) between the top die 102 and the thinned die. In particular, bonding 105 is between the top die 102 and the silicon layer 122, where the bonding 105 is such that a surface of the top die 102 is connected to the power TSV 108 and the signal TSV 110. Similar to FIG. 7G, FIG. 7H further shows solder bonding (C4) or Cu pillar and solder bonding (collectively item 121) between thinned middle die and the packaging substrate 120. As shown the bonding 121 joins the thick BEOL for power 128 to the packaging substrate 120. In a preferred embodiment, the top die 102 to 3D die bonding 105 occurs first followed by C4 121 joining to the packaging substrate 120.

Accordingly, described herein is a method of forming a semiconductor device (100, 100-1, 100-2), comprising forming devices 129 over a first substrate 146 with BEOL interconnects 124, bonding 111 a first carrier wafer 144 over the BEOL interconnects 124, flipping 147 the wafer 145, and thinning the first substrate 146, forming backside interconnects 128 at a backside of the said devices 129, bonding a second carrier wafer 140 over the backside interconnects 128, flipping 148 the wafer 150 and thinning the first carrier wafer 144, forming a short TSV 110 through the thinned first carrier wafer 122 to connect to the BEOL interconnects 124, and forming a tall via (108, 112, 114), which may be in part a TSV, through the thinned first carrier wafer 122, the BEOL levels (124), and the first substrate 146, to connect to the backside interconnects 128.

Further described is a method 300 of forming a semiconductor device (100, 100-1, 100-2), including forming at least one device 129 in a first silicon wafer 146, the first silicon wafer 146 having back end of line interconnects 124 and a super via 112; bonding 111 a second silicon wafer 144 over the back end of line interconnects 124 of the first silicon wafer 146 to form a first wafer structure 145; flipping 147 the first wafer structure 145, and thinning the first silicon wafer 146; forming backside interconnects 128 at a backside of the at least one device 129; bonding a temporary handler 140 over the backside interconnects 128 to form a second wafer structure 150; flipping 148 the second wafer structure 150, and thinning the second silicon wafer 144 (resulting in thinned silicon layer 122); forming a first through silicon via 110 through the thinned second silicon wafer 122 to connect to the back end of line interconnects 124; and forming a second through silicon via 108 through the thinned second silicon wafer 122 to connect to the super via 112 and to the backside interconnects 128.

Thinning the first silicon wafer 146 exposes nano through silicon vias 116 connected to the at least one device 129. The method 300 further including bonding (104, 105) a die 102 to the thinned second silicon wafer 122 using at least one of a solder bonding with a controlled collapse chip connection, a copper pillar and solder bonding, a copper bonding (collectively 104), or a copper hybrid bonding 105. The method 300 further includes bonding 121 a packaging substrate 120 to the backside interconnects 128, wherein the packaging substrate 120 is configured to deliver power through the backside interconnects 128, the super via 112, and the second through silicon via 108 to the die 102.

The examples described herein include a multiple via/TSV where each design may fabricate a respective etch through combinations of Si and BEOL dielectric. One way is to have two consecutive TSV etch steps for power TSVs and signal TSVs. Another way includes Si etching plus bonded oxide etching in both types of TSVs, and then performing a new lithography step for power TSVs to continue the 2 um BEOL etch followed by a less than 0.1 um Si etch. Either way, it is possible to do insulator-based dielectrophoresis (iDEP), diffusion barrier/seed dielectrophoresis, and final Cu plating and CMP in one step, because the TSVs are all 50-52 um deep. This level of variation (5%) in depth for liners/plating etc. may be implemented.

A separate embodiment is to build a super via 112 in the thin BEOL 124 that finally etches through the small second silicon 127 (containing nano TSVs 116). When the top Si 122 is bonded to the thin BEOL 124, the TSV build is the same for the power TSV 108 and the signal TSV 110, since they both go through the top silicon 122 and the bonding oxide layer 111.

To greatly reduce the cost of having at least two vias/TSVs in the wafer, while keeping yield high, two etching steps can be created, while keeping the insulator, liner, seed, plate, and CMP sequence as a single step. The TSVs are only about 4-5% different in total depth. For the separate embodiment, there is only one step for the TSV etch/fill. The examples implement such a construction with a power TSV in a wafer together with the implementation concept of having a thin BEOL 124 and thick BEOL 128 on opposite sides of a silicon sheet 127 that is very thin.

Thus, the examples described herein implement a TSV connection (108, 112, 114) from a first silicon layer 122 to a second silicon layer 127 to a backside PDN. Also described herein is a substrate thinning process, backside interconnects, and TSVs through first 122 and second 127 silicon layers or substrates and first 124 and second 128 BEOL layers or interconnect regions. A two via structure (including the power via 108 and the super via 112) connect the top die 102 directly to the thick BEOL 128.

Figure 8:
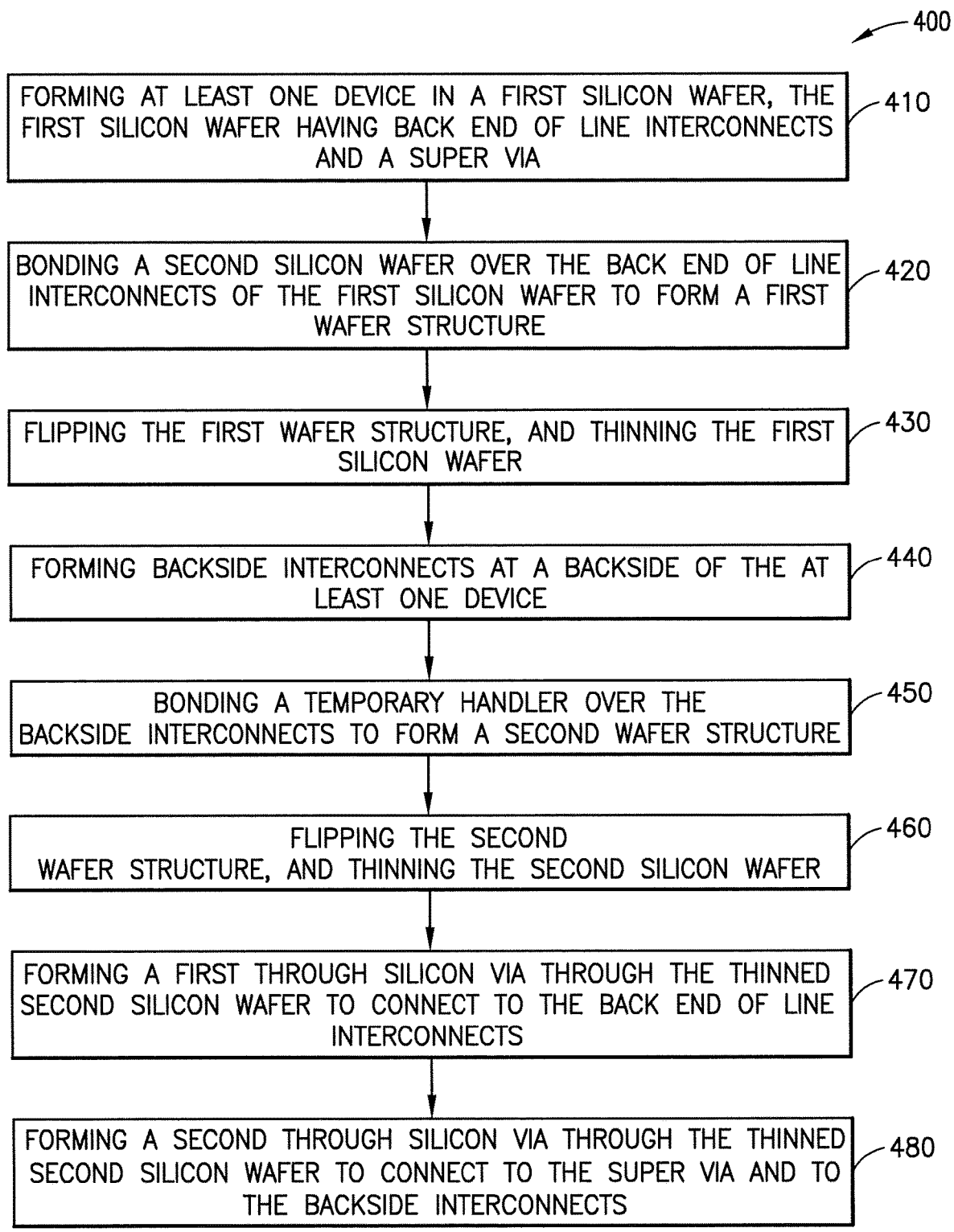
FIG. 8 is a logic flow diagram that illustrates the operation of a method to fabricate a TSV and backside power distribution structure.

The various blocks of method 400 for forming a semiconductor device shown in FIG. 8 may be viewed as method steps, and/or as operations that result from a lithographic process, and/or a topological process, and/or the operation of computer program code, and/or as a plurality of coupled logic circuit elements constructed to carry out the associated function(s). The blocks of method 400 may be performed with different devices, such as with different computer program code implemented with the different devices.

At 410, the method for forming a semiconductor device includes forming at least one device in a first silicon wafer, the first silicon wafer having back end of line interconnects and a super via. At 420, the method includes bonding a second silicon wafer over the back end of line interconnects of the first silicon wafer to form a first wafer structure. At 430, the method includes flipping the first wafer structure, and thinning the first silicon wafer. At 440, the method includes forming backside interconnects at a backside of the at least one device. At 450, the method includes bonding a temporary handler over the backside interconnects to form a second wafer structure. At 460, the method includes flipping the second wafer structure, and thinning the second silicon wafer. At 470, the method includes forming a first through silicon via through the thinned second silicon wafer to connect to the back end of line interconnects. At 480, the method includes forming a second through silicon via through the thinned second silicon wafer to connect to the super via and to the backside interconnects.

There are several advantages and technical effects of the structures and methods described herein. For example, described is a 3D die stack with customized TSV configurations to enable optimized signal and power connections. The power feed from the package uses a slightly longer via (50 um+5 um, or approximately 55 um), namely items 108, 112, and 114 to deliver power to the top die 102 (TSV portion 108 of a same length, with an additional BEOL portion 112). The signal TSV 110 allows signal communications between top and bottom dies.

The back side PDN continues to have a direct power feed from the package C4s (121). A fine BEOL 124 is on the side closer to the top die 102 for all signal communication. The examples described herein provide a combination of power TSVs that go from the packaging substrate 120 to the top die 102, and signal TSVs (including 110) enabling signaling between the top die 102 and bottom die (including the combination of 117, 124, 126, 128). The bottom die (including the combination of 117, 124, 126, 128) gets power from the package substrate 120. The examples described herein benefit memory on logic stacking use cases. Further, the examples described herein may have significant value for systems where 3D chiplet die stacking is combined with the power via concept (i.e. to create a high efficiency power delivery to the logic die).

The structure described herein could become industry standard once substrate thinning and the backside interconnect are widely adopted in the near future.

Referring now to all the Figures, in one exemplary embodiment, a semiconductor device includes an electronic circuit within a device layer; wherein the device layer is between a thin layer of wiring for signal connections having a first thickness and a thick layer of wiring for power having a second thickness, the second thickness being greater than the first thickness; a silicon layer above the device layer, the thin layer of wiring, and the thick layer of wiring; a first via connection from a top of the semiconductor device to the thin layer of wiring; a second via connection from the top of the semiconductor device to the thick layer of wiring; and a packaging substrate with a connection to the thick layer of wiring.

The semiconductor device may further include wherein the second via connection comprises a via stack, the via stack comprising a power via and a super via. The semiconductor device may further include a top die and a lower die, the lower die comprising the silicon layer, the thin layer of wiring, and the thick layer of wiring; wherein the second via connection distributes power from the packaging substrate to the top die. The semiconductor device may further include a top die connected to the first via connection and to the second via connection with a copper hybrid bond structure. The semiconductor device may further include wherein the second via connection distributes power from the packaging substrate to the top of the semiconductor device. The semiconductor device may further include wherein the thin layer of wiring is connected to a first side of the device layer, and the thick layer of wiring is connected to a second side of the device layer.

In another exemplary embodiment, a via within an electronic structure is distributed through a first silicon, a first back end of line, a second silicon, and a second back end of line.

The first back end of line may be thinner than the second back end of line. The first silicon may be thicker than the second silicon. The second back end of line may terminate in a controlled collapse chip connection or copper interconnection to a packaging substrate. The via may be filled with copper. The via may land on a copper level of the second back end of line. The via may be etched through the first silicon, then through the first back end of line, then through the second silicon, then through the second back end of line. A plurality of keep out zones may be created before the via is etched in the first silicon, the first back end of line, the second silicon, and the second back end of line. The via may draw power from a packaging. The via may connect a top die of the electronic structure and the first back end of line.

In another exemplary embodiment, a method of forming a semiconductor device includes forming at least one device in a first silicon wafer, the first silicon wafer having back end of line interconnects and a super via; bonding a second silicon wafer over the back end of line interconnects of the first silicon wafer to form a first wafer structure; flipping the first wafer structure, and thinning the first silicon wafer; forming backside interconnects at a backside of the at least one device; bonding a temporary handler over the backside interconnects to form a second wafer structure; flipping the second wafer structure, and thinning the second silicon wafer; forming a first through silicon via through the thinned second silicon wafer to connect to the back end of line interconnects; and forming a second through silicon via through the thinned second silicon wafer to connect to the super via and to the backside interconnects.

The method may further include thinning the first silicon wafer exposes nano through silicon vias connected to the at least one device. The method may further include bonding a die to the thinned second silicon wafer using at least one of a solder bonding with a controlled collapse chip connection, a copper pillar and solder bonding, a copper bonding, or a copper hybrid bonding. The method may further include bonding a packaging substrate to the backside interconnects, wherein the packaging substrate is configured to deliver power through the backside interconnects, the super via, and the second through silicon via to the die.

In another exemplary embodiment, an apparatus includes at least one semiconductor device joined to at least one middle of line contact, the at least one semiconductor device and the at least one middle of line contact encapsulated within a device dielectric layer over a layer of silicon; a back end of line interconnect layer comprising at least one metal layer, at least one back end of line interconnect level above the at least one metal layer, and at least one first via; wherein the at least one first via is joined to the at least one middle of line contact to connect the back end of line interconnect layer to the at least one semiconductor device; a backside layer joined to the layer of silicon, the backside layer comprising a backside dielectric layer, a backside power rail, and a backside power distribution network; a shallow trench isolation layer between the device dielectric layer and the backside power rail; and a second via connecting the backside power rail to the back end of line interconnect layer.

References to a 'computer', 'processor', etc. should be understood to encompass not only computers having different architectures such as single/multi-processor architectures and sequential or parallel architectures but also specialized circuits such as field-programmable gate arrays (FPGAs), application specific circuits (ASICs), signal processing devices and other processing circuitry. References to computer program, instructions, code etc. should be understood to encompass software for a programmable processor or firmware such as, for example, the programmable content of a hardware device whether instructions for a processor, or configuration settings for a fixed-function device, gate array or programmable logic device etc.

The memory (ies) as described herein may be implemented using any suitable data storage technology, such as semiconductor based memory devices, flash memory, magnetic memory devices and systems, optical memory devices and systems, non-transitory memory, transitory memory, fixed memory and removable memory. The memory (ies) may comprise a database for storing data.

As used herein, circuitry may refer to the following: (a) hardware circuit implementations, such as implementations in analog and/or digital circuitry, and (b) combinations of circuits and software (and/or firmware), such as (as applicable): (i) a combination of processor(s) or (ii) portions of processor(s)/software including digital signal processor(s), software, and memory (ies) that work together to cause an apparatus to perform various functions, and (c) circuits, such as a microprocessor(s) or a portion of a microprocessor(s), that require software or firmware for operation, even if the software or firmware is not physically present. As a further example, as used herein, circuitry would also cover an implementation of merely a processor (or multiple processors) or a portion of a processor and its (or their) accompanying software and/or firmware. Circuitry would also cover, for example and if applicable to the particular element, a baseband integrated circuit or applications processor integrated circuit for a mobile phone or a similar integrated circuit in a server, a cellular network device, or another network device.

List of Abbreviations 3D three-dimensional
ASIC application-specific integrated circuit
BEOL back end of line
BS-BPR back-side buried power rail
BSPDN back-side power delivery network
C4 controlled collapse chip connection
CD critical dimension
CMP chemical mechanical planarization/polishing
FPGA field-programmable gate array
iDEP insulator-based dielectrophoresis
ILD interlayer dielectric
IO input output
IR internal resistance
KOZ keep out zone
M metal layer e.g. M1
MOL middle of line
PDN power delivery network
RDL redistribution layer
S/D semiconductor
STI shallow trench isolation
Temp/temp temporary
TSV through silicon via UBM under bump metallization V via e.g. V0

In the foregoing description, numerous specific details are set forth, such as particular structures, components, materials, dimensions, processing steps, and techniques, in order to provide a thorough understanding of the exemplary embodiments disclosed herein. However, it will be appreciated by one of ordinary skill of the art that the exemplary embodiments disclosed herein may be practiced without these specific details. Additionally, details of well-known structures or processing steps may have been omitted or may have not been described in order to avoid obscuring the presented embodiments.

The description of the present invention has been presented for purposes of illustration and description, but is not intended to be exhaustive or limiting in the form disclosed. Many modifications and variations will be apparent to those of ordinary skill in the art without departing from the scope of the invention. The embodiments were chosen and described in order to best explain the principles of the invention and the practical applications, and to enable others of ordinary skill in the art to understand the invention for various embodiments with various modifications as are suited to the particular uses contemplated.

What is claimed is:

1. A via within an electronic structure, the via comprising:
   a power though silicon via (TSV) extending entirely through a first silicon; and
   a super via connected to the power TSV and extending entirely through a first back end of line, and entirely through a second silicon,
   wherein the super via has a height that is greater than the power TSV, and
   wherein the second silicon includes a chip and a nano-TSV connected to the chip.

2. The via of claim 1, wherein a bottom surface of the super via is connected to a second back end of line, and wherein the first back end of line is thinner than the second back end of line.

3. The via of claim 1, wherein the first silicon is thicker than the second silicon.

4. The via of claim 2, wherein the second back end of line terminates in a controlled collapse chip connection or copper interconnection to a packaging substrate.

5. The via of claim 1, wherein the power TSV and the super via are filled with copper.

6. The via of claim 2, wherein the super via lands on a copper level of the second back end of line.

7. The via of claim 1, wherein the via is etched through the first silicon, then through the first back end of line, and then through the second silicon.

8. The via of claim 1, wherein a plurality of keep out zones are created before the via is etched in the first silicon, the first back end of line, and the second silicon.

9. The via of claim 1, wherein the via draws power from a packaging.

10. The via of claim 1, wherein the via connects a top die of the electronic structure and the first back end of line.

* * * * *